(12) United States Patent
Shimoi et al.

(10) Patent No.: US 8,541,319 B2
(45) Date of Patent: *Sep. 24, 2013

(54) LASER PROCESSING METHOD

(75) Inventors: Hideki Shimoi, Hamamatsu (JP); Keisuke Araki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/388,716

(22) PCT Filed: Jul. 19, 2011

(86) PCT No.: PCT/JP2011/066356
§ 371 (c)(1),
(2), (4) Date: Feb. 3, 2012

(87) PCT Pub. No.: WO2012/014721
PCT Pub. Date: Feb. 2, 2012

(65) Prior Publication Data
US 2012/0129359 A1 May 24, 2012

(30) Foreign Application Priority Data
Jul. 26, 2010 (JP) .................................. 2010-167400

(51) Int. Cl.
*H01L 21/268* (2006.01)
(52) U.S. Cl.
USPC .................................. 438/795; 257/E21.347
(58) Field of Classification Search
USPC .......................... 438/795, 667, 668; 257/774
See application file for complete search history.

(56) References Cited

U.S. PATENT DOCUMENTS 6,677,237 B2 * 1/2004 Umetsu et al. ................ 438/667
6,992,026 B2 1/2006 Fukuyo et al.
(Continued)

FOREIGN PATENT DOCUMENTS

JP 4-150212 5/1992
JP 7-40482 5/1995
(Continued)

OTHER PUBLICATIONS

Mitsuru Watanabe et al., "Femtosecond laser-assisted three-dimensional microfabrication in silica," Optics Letters, Mar. 1, 2001, vol. 26, No. 5, pp. 277-279.

(Continued)

*Primary Examiner* — Kimberly Rizkallah
*Assistant Examiner* — Mounir Amer
(74) *Attorney, Agent, or Firm* — Drinker Biddle & Reath LLP

(57) ABSTRACT

A laser processing method comprises a laser light converging step of converging a laser light at a sheet-like object to be processed made of silicon so as to form a modified region within the object, and an etching step of anisotropically etching the object so as to thin the object to a target thickness and advancing the etching selectively along the modified region so as to form the object with a through hole tilted with respect to a thickness direction of the object after the laser light converging step, wherein the laser light converging step forms a first modified region as the modified region in a part corresponding to the through hole in the object and a second modified region as the modified region extending parallel to the thickness direction and joining with the first modified region in a part to be removed upon thinning by the anisotropic etching in the object, and wherein the etching step advances the etching selectively along the second modified region and then along the first modified region while thinning the object and completes forming the through hole when the object is at the target thickness.

2 Claims, 15 Drawing Sheets

(56) References Cited

U.S. PATENT DOCUMENTS

| | | | |
|---|---|---|---|
| 7,033,519 B2 | 4/2006 | Taylor et al. | |
| 8,048,804 B2 * | 11/2011 | Mitani | 438/675 |
| 2005/0272223 A1 | 12/2005 | Fujii et al. | |
| 2007/0212890 A1 * | 9/2007 | Sakai et al. | 438/733 |
| 2009/0065481 A1 * | 3/2009 | Kishimoto et al. | 216/87 |
| 2010/0136766 A1 | 6/2010 | Sakamoto et al. | |

FOREIGN PATENT DOCUMENTS

| | | |
|---|---|---|
| JP | 10-202878 | 8/1998 |
| JP | 2873937 | 1/1999 |
| JP | 2000-246475 | 9/2000 |
| JP | 2002-210730 | 7/2002 |
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-1211 | 1/2005 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-169993 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-167804 | 6/2006 |
| JP | 2006-176355 | 7/2006 |
| JP | 2006-290630 | 10/2006 |
| JP | 2006-352171 | 12/2006 |
| JP | 2007-36758 | 2/2007 |
| JP | 2007-88402 | 4/2007 |
| JP | 2007-101833 | 4/2007 |
| JP | 2010-142837 | 7/2010 |
| JP | 2010-155259 | 7/2010 |
| WO | 00/40482 | 7/2000 |

OTHER PUBLICATIONS

U.S. Office Action dated Dec. 28, 2012 that issued in U.S. Appl. No. 13/389,050 including Double Patenting Rejection on pp. 2-4.

* cited by examiner

Fig.9
(a)
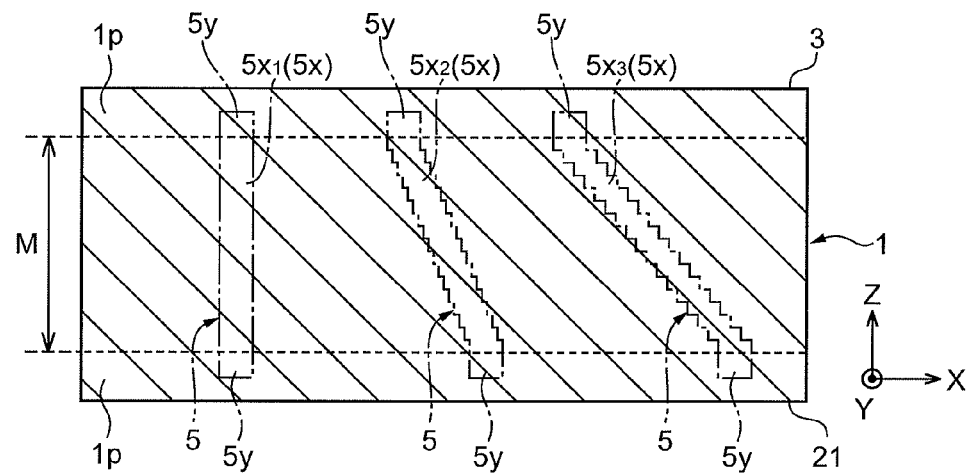
(b)
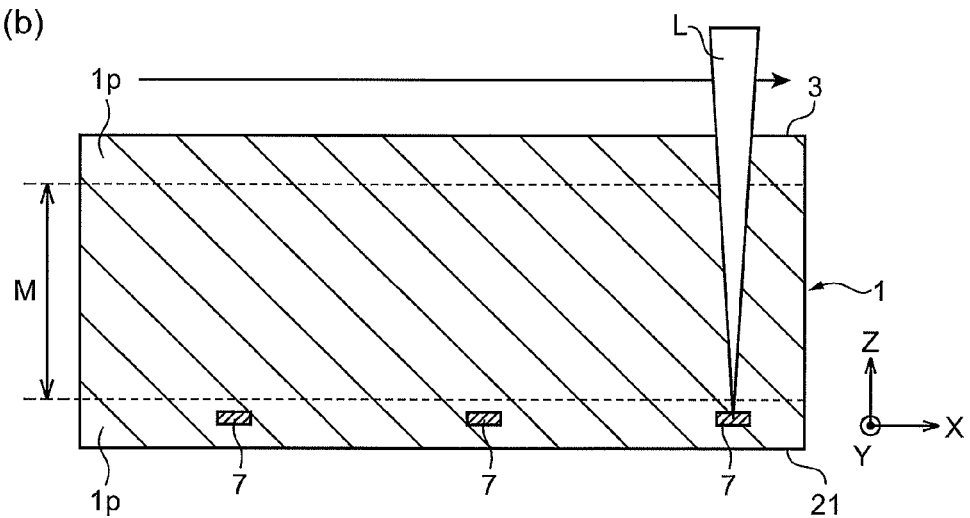

Fig.10
(a)
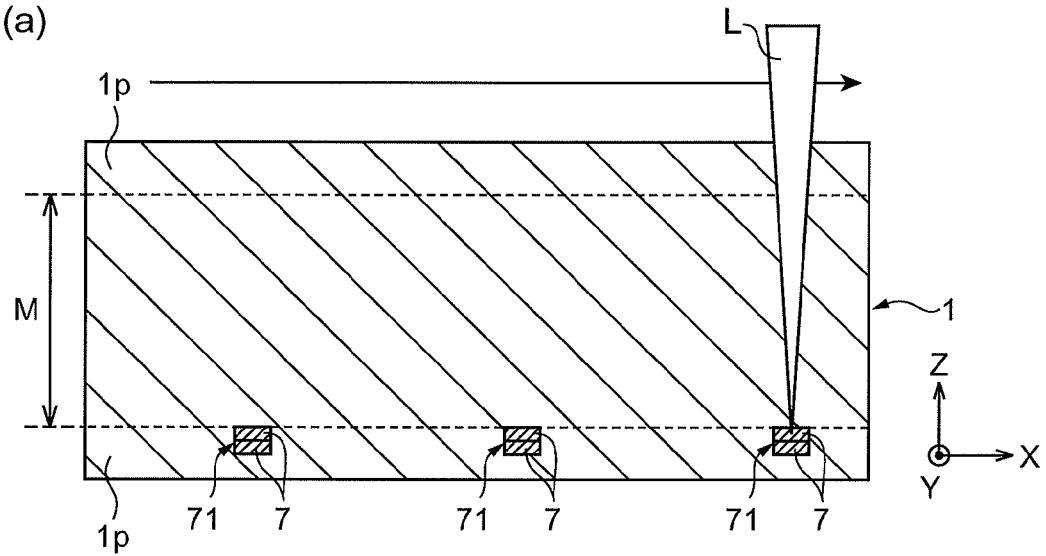
(b)
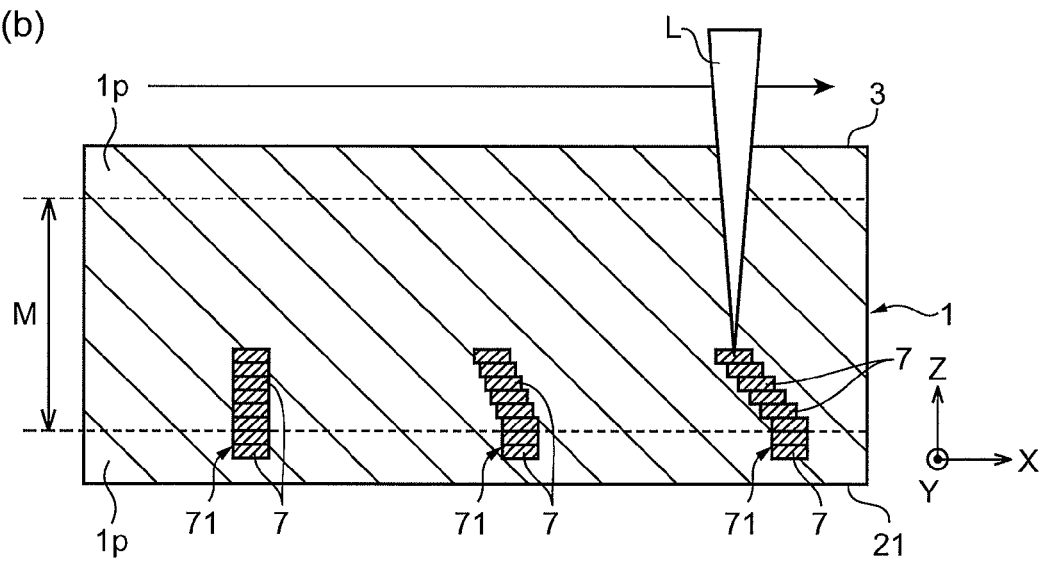

Fig.11
(a)
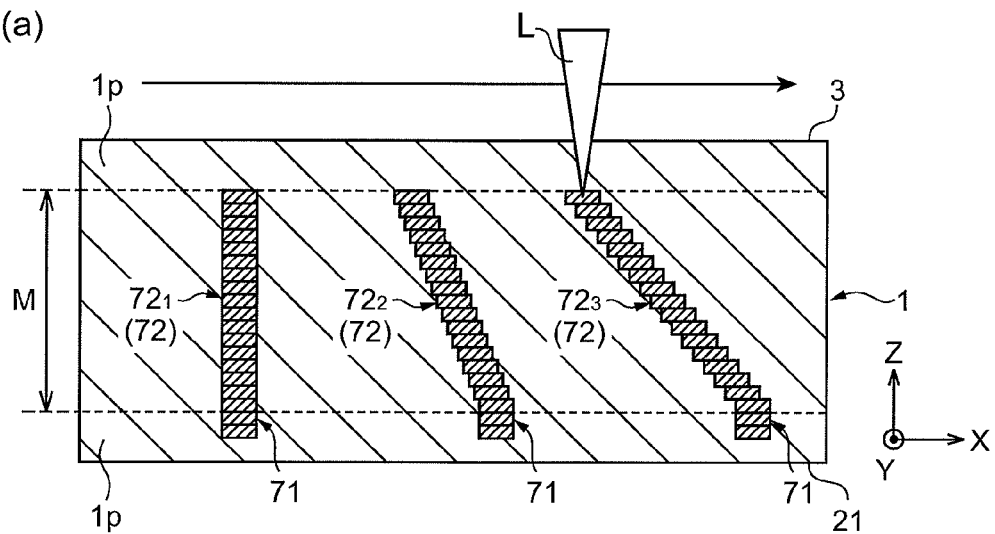
(b)
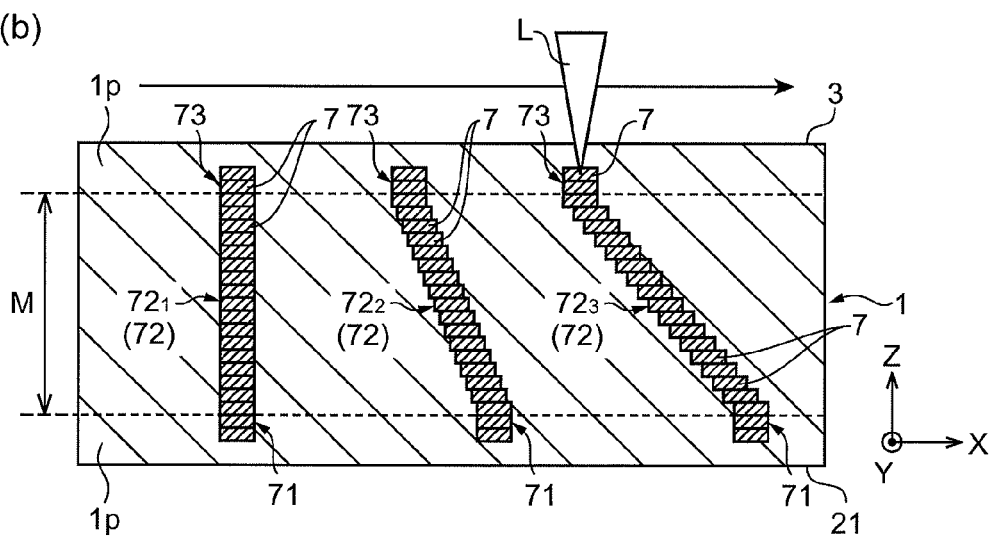

Fig.15
(a)
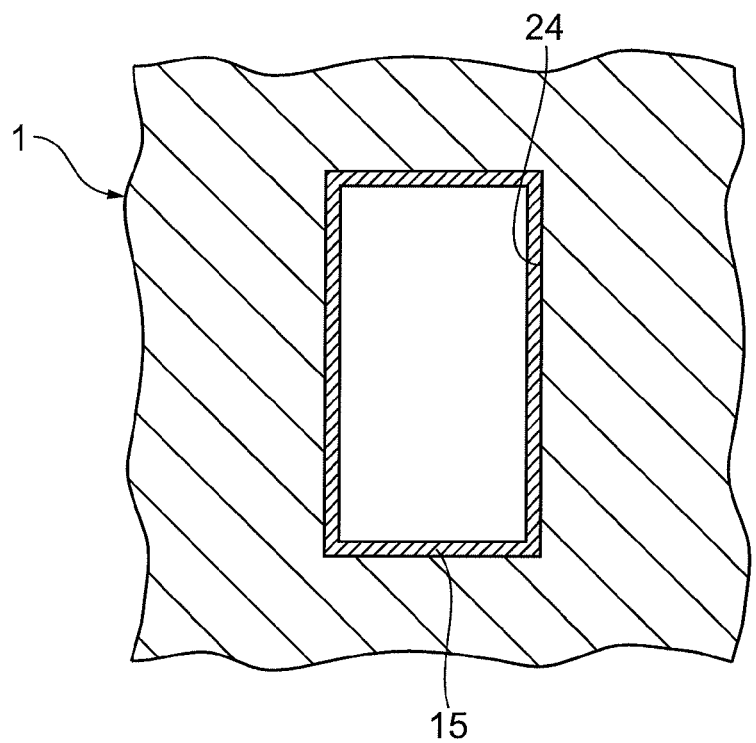
(b)
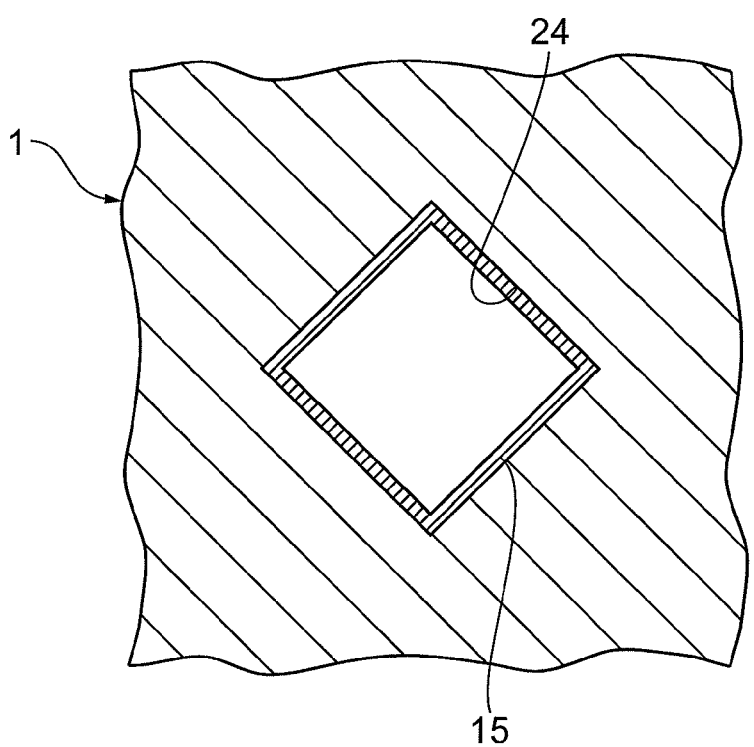

LASER PROCESSING METHOD

TECHNICAL FIELD

The present invention relates to a laser processing method and, in particular, to a laser processing method for forming a through hole in an object.

BACKGROUND ART

Known as an example of conventional laser processing methods is one comprising converging a laser light at a sheet-like object to be processed so as to form a modified region within the object and then etching the object so as to remove the modified region, thereby forming a through hole extending in a thickness direction in the object (see, for example, Patent Literature 1).

CITATION LIST

Patent Literature

Patent Literature 1: Japanese Patent Application Laid-Open No. 2005-74663

SUMMARY OF INVENTION

Technical Problem

However, when etching the object, the above-mentioned laser processing method may enhance the pore size of the through hole on the opening side by removing the opening side of the through hole in the object as the etching proceeds. Therefore, it has been desired for the above-mentioned laser processing method to restrain the pore size from increasing and accurately form the through hole. Also, while being applied to various fields, laser processing methods in recent years have been demanded to facilitate their processing.

It is therefore an object of the present invention to provide a laser processing method which can form through holes accurately and facilitate the processing.

Solution to Problem

For achieving the above-mentioned object, the laser processing method in accordance with one aspect of the present invention is a laser processing method comprising a laser light converging step of converging a laser light at a sheet-like object to be processed made of silicon so as to form a modified region within the object, and an etching step of anisotropically etching the object so as to thin the object to a target thickness and advancing the etching selectively along the modified region so as to form the object with a through hole tilted with respect to a thickness direction of the object after the laser light converging step, wherein the laser light converging step forms a first modified region as the modified region in a part corresponding to the through hole in the object and a second modified region as the modified region extending parallel to the thickness direction and joining with the first modified region in a part to be removed upon thinning by the anisotropic etching in the object, and wherein the etching step advances the etching selectively along the second modified region and then along the first modified region while thinning the object and completes forming the through hole when the object is at the target thickness.

In this laser processing method, the etching for the first modified region does not begin to progress when the object is at a target thickness, but is induced to start to advance by the second modified region formed in the part to be removed by thinning during the thinning of the object to the target thickness by anisotropic etching, and the forming of the through hole is completed when the object is thinned to the target thickness. This can inhibit the opening side of the through hole in the object from being removed and restrain the through hole from enhancing the pore size on the opening side, whereby the through hole can be formed accurately. Since the second modified region extends parallel to the thickness direction, it becomes easier to specify and manage a converging point of the laser light when forming the second modified region, whereby the laser processing can be facilitated.

The object may have a main face in a (100) plane. In this case, a through hole tilted with respect to the thickness direction can be formed favorably.

The laser light converging step may comprise a first step of repeatedly performing a step of irradiating the object with the laser light while relatively moving a converging point of the laser light along a first direction orthogonal to an irradiation direction of the laser light, while changing a depth position of the converging point in the irradiation direction, and a second step of repeatedly performing the first step while changing a position of the converging point in a second direction orthogonal to the irradiation direction and first direction. This can shorten the takt time in the laser light converging step.

Advantageous Effects of Invention

The laser processing method of the present invention can accurately form through holes and facilitate the processing.

BRIEF DESCRIPTION OF DRAWINGS

[FIG. 9] (a) is a flow diagram illustrating the embodiment, while (b) is a flow diagram illustrating a sequel to FIG. 9(a);

[FIG. 10] (a) is a flow diagram illustrating a sequel to FIG. 9(b), while (b) is a flow diagram illustrating a sequel to FIG. 10(a);

[FIG. 11] (a) is a flow diagram illustrating a sequel to FIG. 10(b), while (b) is a flow diagram illustrating a sequel to FIG. 11(a);

[FIG. 15] (a) is a sectional view corresponding to FIG. 13 and illustrating another example of through holes, while (b) is a sectional view corresponding to FIG. 13 and illustrating still another example of through holes.

DESCRIPTION OF EMBODIMENTS

In the following, preferred embodiments of the present invention will be explained in detail with reference to the drawings. In the explanation of the drawings, the same or equivalent constituents will be referred to with the same signs while omitting their overlapping descriptions.

The laser processing method in accordance with an embodiment converges a laser light into an object to be processed, so as to form a modified region. Therefore, the forming of the modified region will firstly be explained in the following with reference to FIGS. 1 to 6.

Figure 1:
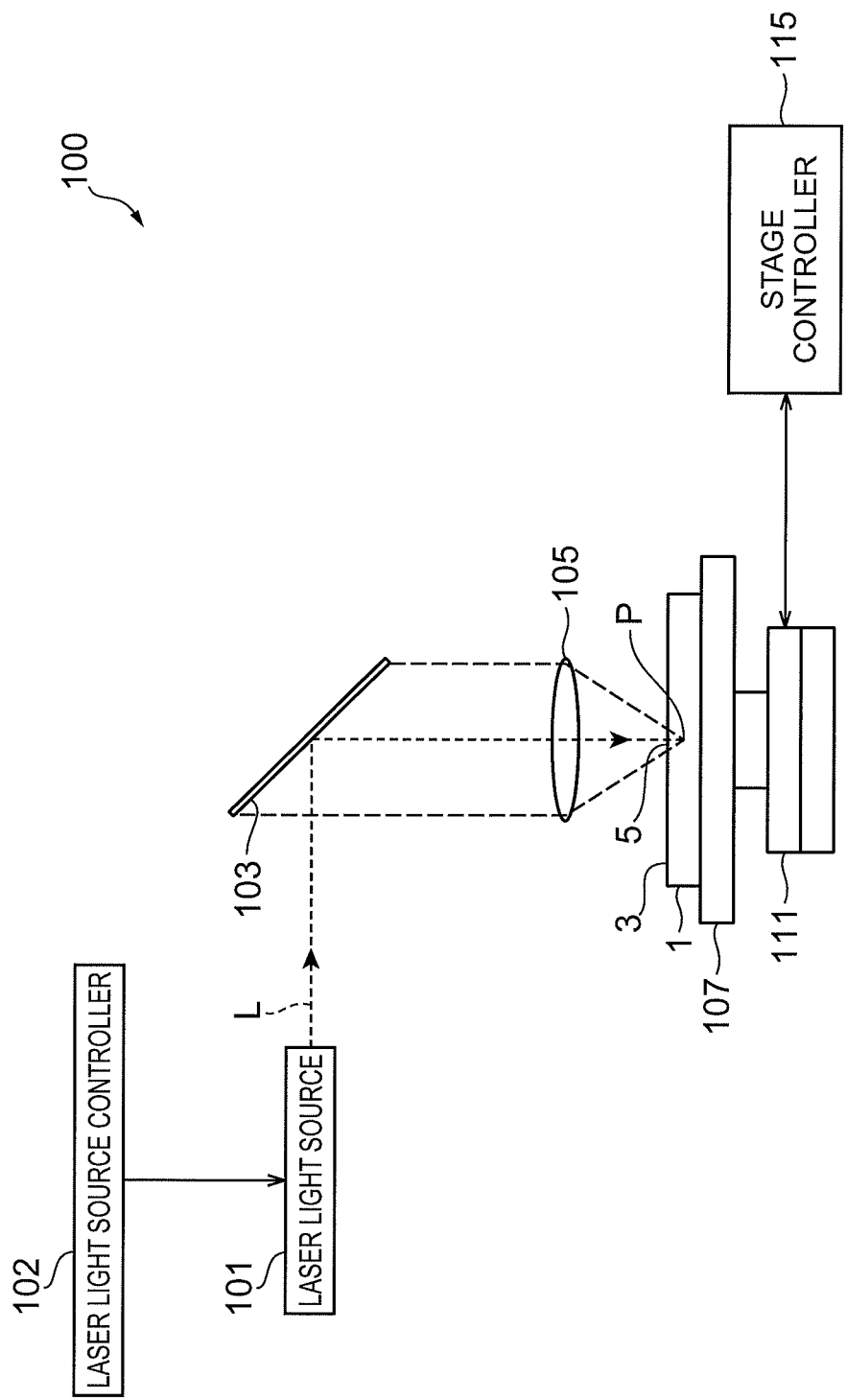
[FIG. 1] is a schematic structural diagram of a laser processing device used for forming a modified region.

As illustrated in FIG. 1, a laser processing device 100 comprises a laser light source 101 which causes a laser light L to oscillate in a pulsating manner, a dichroic mirror 103 arranged such as to change the direction of the optical axis (optical path) of the laser light L by 90°, and a condenser lens 105 for converging the laser light L. The laser processing device 100 also comprises a support table 107 for supporting a object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a part to form a modified region 5. This forms a modified region in the object 1 along the part 5.

Figure 2:
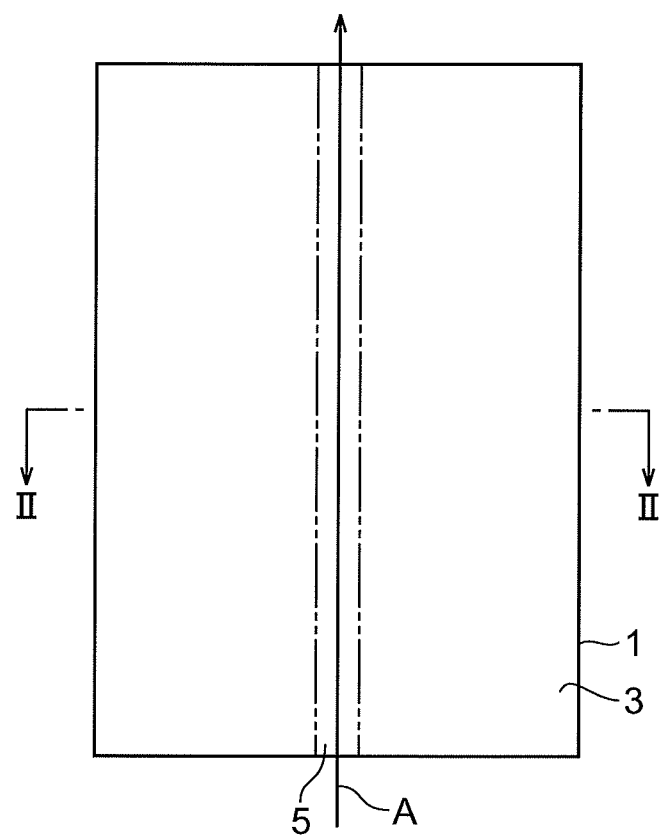
[FIG. 2] is a plan view of an object to be processed in which the modified region is to be formed.
Figure 3:
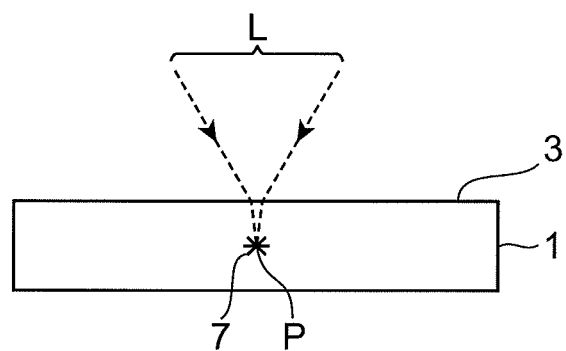
[FIG. 3] is a sectional view of the object taken along the line III-III of FIG. 2.
Figure 4:
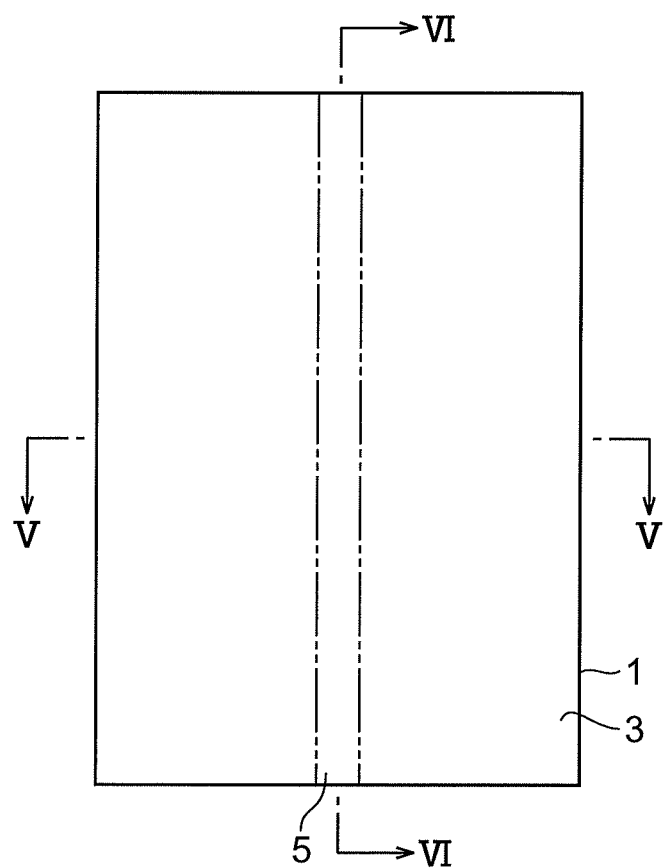
[FIG. 4] is a plan view of the object after laser processing.
Figure 5:
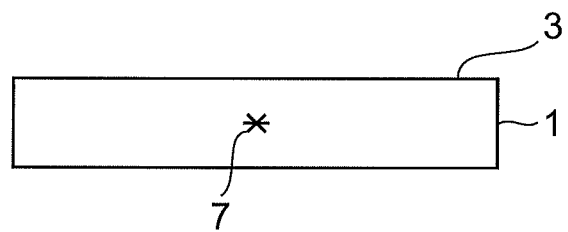
[FIG. 5] is a sectional view of the object taken along the line V-V of FIG. 4.
Figure 6:
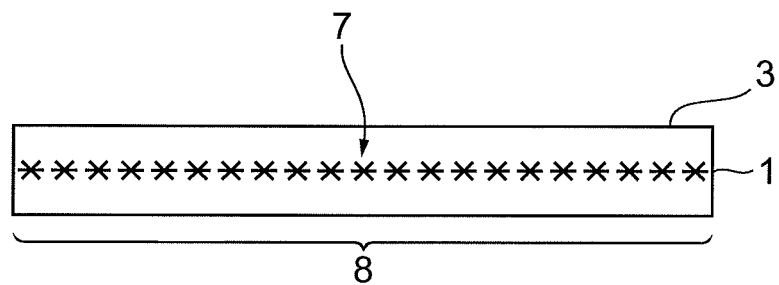
[FIG. 6] is a sectional view of the object taken along the line VI-VI of FIG. 4.

As illustrated in FIG. 2, the part 5 is set in the object 1, for which a semiconductor material, a piezoelectric material, or the like is used. Here, the part 5 is a virtual line extending straight. When forming a modified region within the object 1, the laser light L is relatively moved along the part 5 (i.e., in the direction of arrow A in FIG. 2) while locating a converging point P within the object 1 as illustrated in FIG. 3. This forms a modified region 7 within the object 1 along the part 5 as illustrated in FIGS. 4 to 6, whereby the modified region 7 becomes a removing region 8 to be removed by etching which will be explained later.

The converging point P is a position at which the laser light L is converged. The part 5 may be curved instead of being straight, shaped into a three-dimensional form combining them, or specified in terms of coordinates. The modified region 7 may be formed either continuously or intermittently. The modified region 7 may be formed like lines or dots. It will be sufficient if the modified region 7 is formed at least within the object 1. There are cases where a fracture is formed from the modified region 7 acting as a start point, and the fracture and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser processing). In the case of forming a removing part such as a hole or groove by melting it away from the front face 3 (surface absorption type laser processing), the processing region gradually progresses from the front face 3 side to the rear face side in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region 7 include an area where the density has changed from that of an unmodified region in a material of the object 1 and an area formed with a lattice defect (which may collectively be referred to as a high-density transitional region).

The molten processed regions, refractive index changed regions, areas where the modified region 7 has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region 7 or in only a part or a plurality of parts thereof. Examples of the object 1 include those containing or constituted by silicon.

Here, this embodiment forms the modified region 7 in the object 1 and then etches the object 1, so as to advance the etching selectively along the modified region 7 (i.e., along the modified region 7, fractures included in the modified region 7, or fractures from the modified region 7), thereby removing a part extending along the modified region 7 in the object 1. These fractures are also known as cracks, microcracks, fractures, and the like (hereinafter simply referred to as "fractures").

In the etching in this embodiment, for example, a capillary action or the like is utilized so that fractures included in the modified region 7 of the object 1 or fractures from the modified region 7 are impregnated with an etchant, so as to advance (develop) the etching along fracture surfaces. This advances the etching selectively at a higher etching rate (etching speed) along the fractures in the object 1 and removes them. At the same time, by utilizing the characteristic feature that the etching rate of the modified region 7 itself is high, the etching is selectively advanced along the modified region 7, so as to remove it.

Examples of the etching include a case where the object 1 is immersed in the etchant (dipping) and a case where the object 1 is coated with the etchant while being rotated (spin etching).

Examples of the etchant include KOH (potassium hydroxide), TMAH (aqueous tetramethylammonium hydroxide solution), EDP (ethylenediamine pyrocatechol), NaOH (sodium hydroxide), CsOH (cesium hydroxide), $NH_4OH$ (ammonium hydroxide), and hydrazine. The etchant to be used is not limited to liquids but may be in the form of a gel (jelly or semisolid). Here, the etchant is used at a temperature ranging from ambient temperature to about 100° C., which is set appropriately according to a required etching rate or the like. When etching Si with KOH, for example, the temperature is preferably about 60° C.

As the etching, this embodiment performs anisotropic etching which is etching having a higher (or lower) etching rate in a specific direction. The anisotropic etching is applicable not only to relatively thin objects but also to thick ones (having a thickness of 800 μm to 100 μm, for example). In this case, even when the surface to be formed with the modified region 7 differs from its plane direction, the etching can be advanced along the modified region 7. That is, the anisotropic etching here enables not only the etching of the plane direction in conformity to the crystal orientation, but also the etching independent of the crystal orientation.

Figure 7:
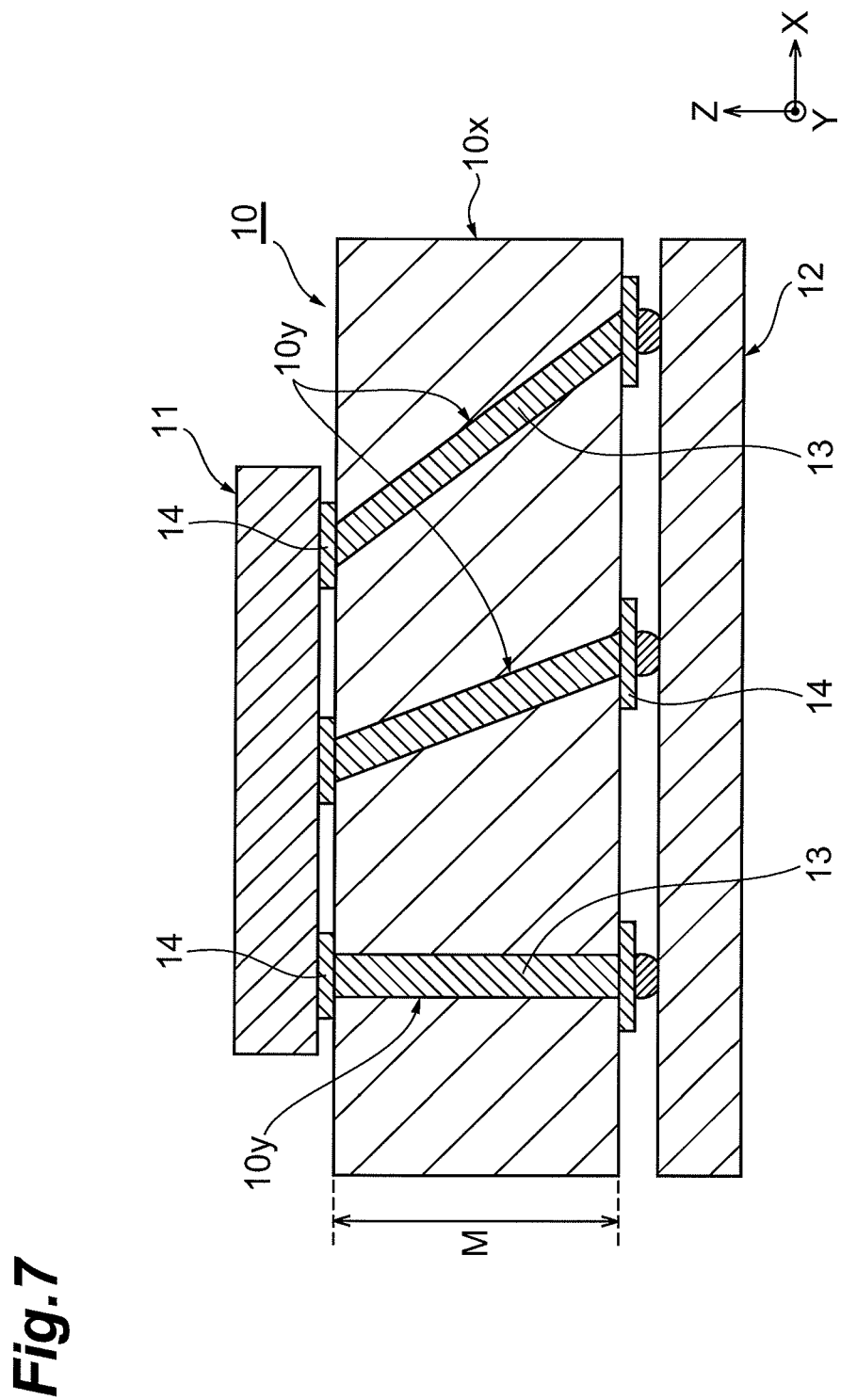
[FIG. 7] is a schematic sectional view illustrating an interposer manufactured by an embodiment.
Figure 8:
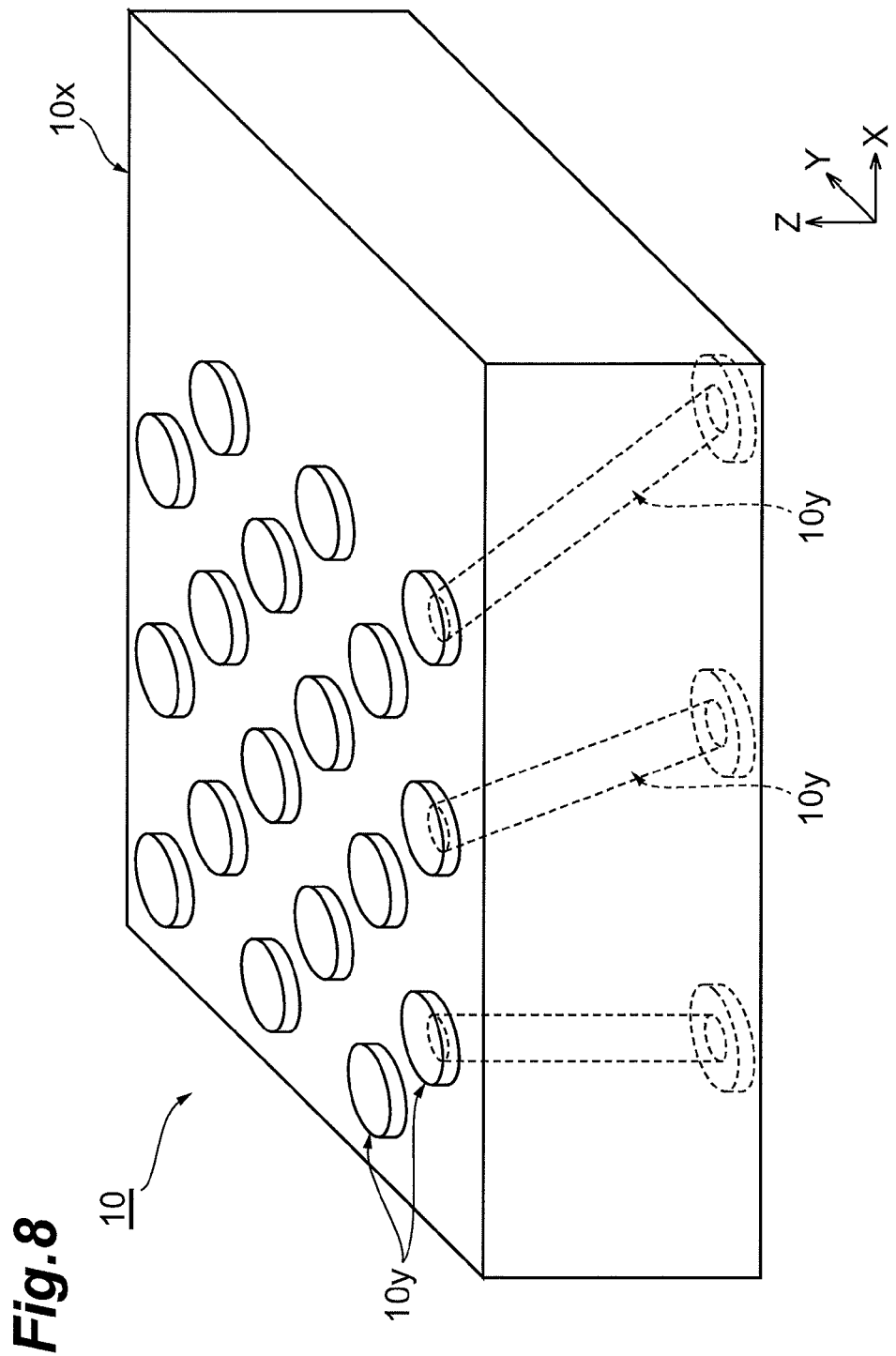
[FIG. 8] is a schematic perspective view of the interposer of FIG. 7.
Figure 12:
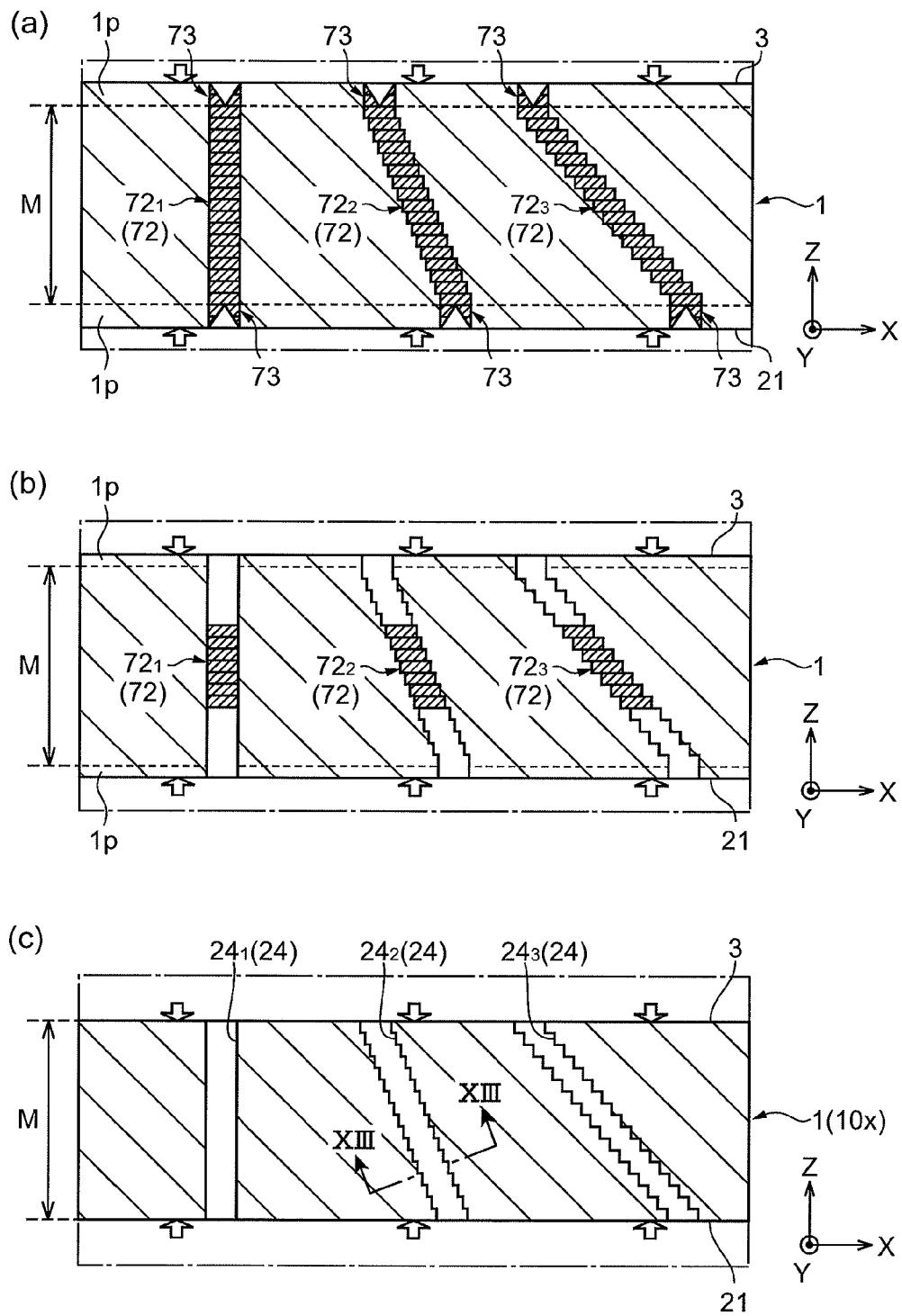
[FIG. 12] (a) is a flow diagram illustrating a sequel to FIG. 11(b), (b) is a flow diagram illustrating a sequel to FIG. 12(a), and (c) is a flow diagram illustrating a sequel to FIG. 12(b)

The laser processing method in accordance with an embodiment will now be explained in detail. FIG. 7 is a schematic sectional view illustrating an interposer manufactured by this embodiment, while FIG. 8 is a schematic perspective view of the interposer of FIG. 7. The laser processing method of this embodiment manufactures an interposer as a relay board for electrically connecting electronic components to each other.

As illustrated in FIGS. 7 and 8, an interposer 10 is a silicon interposer comprising a substrate 10x and a plurality of through-hole electrodes 10y provided in the substrate 10x. As illustrated in FIG. 7, this interposer 10 constitutes connection wiring between a semiconductor device 11 such as an IC chip and a flexible cable (flexible printed board) 12, while converting their wiring pitches.

The substrate 10x is made of silicon and formed like a flat sheet having a target thickness M which is 200 μm, for example. The through-hole electrodes 10y, each including a conductor 13 and pads 14, electrically connect the front and rear sides of the substrate 10x to each other. As illustrated in FIG. 8, a plurality of through-hole electrodes 10y are arranged in a staggered manner as seen from the front face of the object 1. That is, the plurality of through-hole electrodes 10y are arranged such that a pair of through-hole electrodes 10y close to each other in the Y direction are shifted from each other by a half pitch, for example, in the X direction.

FIGS. 9 to 12 are flow diagrams illustrating the laser processing method in accordance with this embodiment. As illustrated in FIGS. 9 to 12, this embodiment converges the laser light L at the object 1, so as to form modified regions 7 within the object 1. Then, predetermined parts on the front face 3 side and rear face 21 side of the object 1 are removed as removing parts 1p by anisotropic etching, so as to thin the object 1 to the target thickness M. At the same time, the etching is selectively advanced along the modified regions 7, so as to form a plurality of through holes 24.

As illustrated in FIG. 9(a), the object 1 is a sheet-like silicon substrate which is transparent to the wavelength (e.g., 1064 nm) of the laser light L with which it is irradiated. The object 1 has a thickness of 300 μm, for example, which is greater than the target thickness M. The object 1 has the front face 3 and rear face 21 (main faces), which are (100) planes. In the object 1, parts to form a modified region 5 are programmably set as being specified by three-dimensional coordinates. The parts 5 have first parts to form a modified region 5x and second parts to form a modified region 5y.

The first parts 5x are set along the parts corresponding to the through holes 24 (see FIG. 12(c)) within the object 1. The first parts 5x herein include first parts $5x_1$ extending in the thickness direction of the object 1, first parts $5x_2$ tilted with respect to the thickness direction, and first parts $5x_3$ tilted with respect to the thickness direction by a greater angle than the first parts $5x_2$. The first parts $5x_2$, $5x_3$ extend along (111) planes of the object 1.

The second parts 5y are set in the removing parts 1p on the front face 3 side and rear face 21 side within the object 1. A plurality of second parts 5y are set so as to join with both ends of the first parts 5x, respectively, and extend parallel to the thickness direction of the object 1.

The following explanations will assume the thickness direction of the object 1 (irradiation direction of the laser light L) to be the Z direction, the direction in which the parts 5 (through holes 24) are tilted with respect to the thickness direction to be the X direction, and the direction orthogonal to the X and Z directions to be the Y direction.

First, when processing the object 1 in this embodiment, the object 1 is mounted on the mount table with the front face 3 facing up. Subsequently, as illustrated in FIG. 9(b), a converging point of the laser light L (hereinafter simply referred to as "converging point") is located at the removing part 1p on the rear face 21 side within the object 1. Then, while relatively moving the converging point in the X direction, irradiation with the laser light L (hereinafter simply referred to as "scan") is performed in an on/off manner from the front face 3 side such that modified regions 7 are formed in the parts 5. This forms the modified regions 7 at respective positions on the second parts 5y in the removing part 1p on the rear face 21 side.

Here, since spot irradiation is performed with a pulsed laser light as the laser light L, the modified regions 7 formed thereby are constituted by modified spots. Thus formed modified regions 7 include fractures generated from the modified regions 7 (ditto in the following modified regions 7).

Next, as illustrated in FIG. 10(a), the position of the converging point in the Z direction is moved by a predetermined amount toward the front face 3, and then the above-mentioned scan is performed again, whereby modified regions 7 joining on the front face 3 side with the existing modified regions 7 are newly formed at respective positions on the second parts 5y in the removing part 1p on the rear face 21 side. As a result, modified regions 71 extending parallel to the Z direction (i.e., extending substantially linearly along the Z direction so as not to intersect the Z direction) are formed within the removing part 1p on the rear face 21 side.

Subsequently, as illustrated in FIGS. 10(b) to 11(b), the above-mentioned scan is repeatedly performed while progressively changing the position of the converging point in the Z direction from the rear face 21 side to the front face 3 side. This forms modified regions 72 joining with the existing modified regions 71 in the parts corresponding to the through holes 24 within the object 1, and modified regions 73 joining with the existing modified regions 72 and extending parallel to the Z direction (i.e., extending substantially linearly along the Z direction so as not to intersect the Z direction) within the removing part 1p on the front face 3 side. That is, the modified regions 72 as the first modified regions extending in conformity to the through holes 24 are formed in the parts other than the removing parts 1p within the object 1, while the modified regions 71, 73 as the second modified regions joining with the respective end parts of the modified regions 72 and extending straight in the Z direction are formed in the removing parts 1p so as not to be exposed to the front face 3 and rear face 21.

Then, the steps illustrated in FIGS. 9(b) to 11(b) mentioned above are repeatedly performed while changing the position of the converging point of the laser light L in the Y direction. The foregoing forms a plurality of modified regions 72 in conformity to a plurality of through holes 24 within the object 1, and a plurality of modified regions 71, 73 joining with their corresponding modified regions 72 and extending parallel to the Z direction within the removing parts 1p.

The modified regions 72 are formed along the first parts $5x_1$ to $5x_3$ and thus include modified regions $72_1$ extending in the Z direction, modified regions $72_2$ tilted in the X direction with respect to the Z direction, and modified regions $72_3$ tilted in the same direction by a greater angle than the modified regions $72_2$. Here, the sizes, lengths, and the like of the modified regions 71, 73 are made such that the etching time required for thinning the object 1 to the target thickness M and the total of the respective etching times for etching the modified regions 71 to 73 equal each other in anisotropic etching in a later stage.

Next, the object 1 is etched for 60 min with KOH at 85° C., for example, as an etchant. This gradually removes the removing parts 1p in the object 1 from the front face 3 side and rear face 21 side, thereby progressively thinning the object 1. Then, when the object 1 is thinned until the modified regions 71, 73 are exposed as illustrated in FIG. 12(a), the modified regions 71, 73 are impregnated with the etchant, whereby etching starts along the modified regions 71, 73. Subsequently, while the object 1 is thinned, its inside is selectively etched away along the modified regions 71, 73.

Then, as illustrated in FIG. 12(b), while the removal of the removing parts 1p advances, so that the object 1 is continuously thinned, the etchant infiltrates from the modified regions 71, 73 into the modified regions 72, whereby the etching starts to progress along the modified regions 72. Subsequently, while the object 1 is thinned, the inside of the object 1 is selectively etched away along the modified regions 72.

Thereafter, while the removal of the removing parts 1p progresses so as to thin the object 1 further continuously, the etching advances in the modified regions 72. Then, when the thickness of the object 1 equals the target thickness M as illustrated in FIG. 12(c), the object 1 is penetrated along the modified regions 72, whereby the forming of a plurality of through holes 24 is completed.

The plurality of through holes 24 are arranged so as to correspond to the above-mentioned through-hole electrodes 10y. Specifically, the plurality of through holes 24 are arranged in a staggered manner as seen from the front face 3 of the object 1. That is, in the plurality of through holes 24, the through holes 24 aligning in the X direction, which is their tilted direction, are staggered in the Y direction perpendicular to the tilted direction as seen from the front face 3. In other words, when seen from the front face 3, a group of through holes 24 arranged in the X direction align in the Y direction while shifting in the X direction. Hence, when seen from the front face 3, they are arranged such that one through hole 24 is surrounded by four through holes 24 which are located close to each other. Here, the plurality of through holes 24 are arranged such that a pair of through holes 24, 24 close to each other in the Y direction shift from each other by a half pitch in the X direction, for example.

Figure 13:
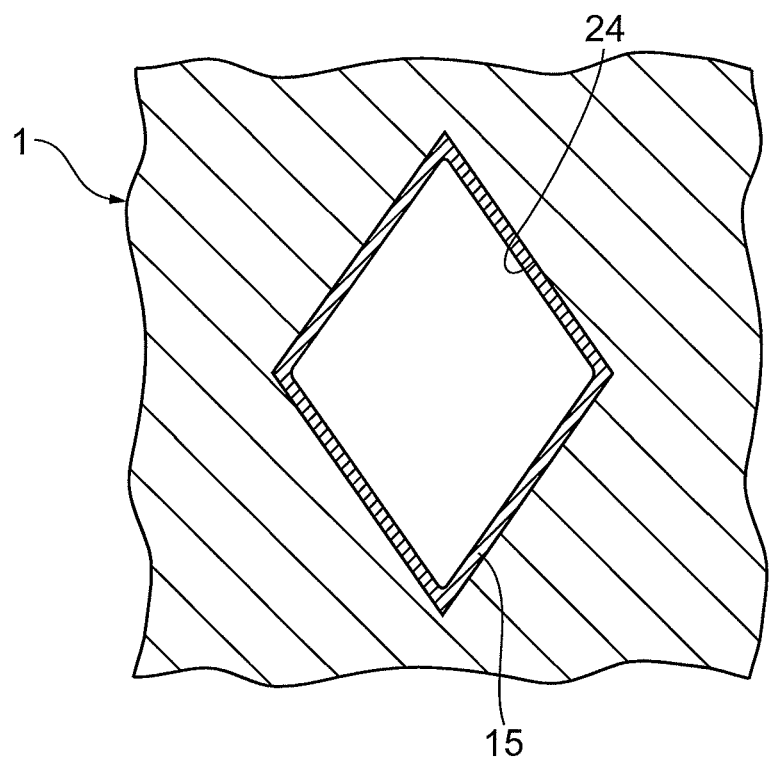
[FIG. 13] is a sectional view corresponding to a cross section taken along the line XIII-XIII of FIG. 12(c) and illustrating a through hole formed by the embodiment.

Since the anisotropic etching is performed as mentioned above in this embodiment, the (111) planes of the object 1 are harder to etch (have a lower etching rate). Therefore, in the modified regions 72 extending along the (111) planes, the etching advances favorably, so that the inner faces of the resulting through holes 24 become smooth surfaces with less depressions and projections. As illustrated in FIG. 13, the through holes 24 have substantially rectangular (diamond-shaped) cross sections, while varying less in inner sizes along their axes.

As illustrated in FIG. 12(c), the through holes 24 are formed along the modified regions $72_1$ to $72_2$, respectively, and thus include through holes $24_1$ extending in the Z direction, through holes $24_2$ tilted in the X direction with respect to the Z direction, and through holes $24_3$ tilted in the same direction by a greater angle than the through holes $24_2$.

Next, the object 1 is oxidized by wet oxidation or the like, so as to produce an electrically insulating oxide film as an insulating film on the inner face (inner wall) of each through hole 24. Here, as illustrated in FIG. 13, the inner face of the through hole 24 is a smooth surface, while its cross section is substantially rectangular, so that projections where the insulating film is hard to grow do not exist on the inner face of the through hole 24, whereby a uniform insulating film 15 can be formed, so as to suppress defects in the insulating film 15.

Thereafter, a conductor 13 is inserted into each through hole 24, and pads 14 are formed on the front face 3 and rear face 21 so as to electrically connect with the conductor 13. This constructs the object 1 as the substrate 10x and the through holes 24 as the through-hole electrodes 10y, thereby yielding the interposer 10.

In this embodiment, as in the foregoing, the etching for the modified regions 72 does not begin to progress when the object 1 is at the target thickness M, but is induced to start to advance by the modified regions 71, 73 formed in the removing parts 1p when thinning the object 1 to the target thickness M by anisotropic etching, and the forming of the through holes 24 is completed when the object 1 is thinned to the target thickness M. This can inhibit the object 1 from being removed in excess on the opening sides (front face 3 side and rear face 21 side) of the through holes 24 and restrain the through holes 24 from increasing their pore size (aperture size) on the opening sides and their inner widths, whereby the through holes 24 can be formed accurately in the object 1 having the target thickness M.

That is, in maskless laser processing, this embodiment can form desirable through holes 24 while adjusting the thickness of the object 1. Specifically, the modified regions 71, 73 for guiding the etching to the modified regions 72 (regulating the etching of the modified regions 72) are formed in the removing parts 1p, whereby the forming of the through holes 24 can be completed at the time of thinning to the target thickness M in anisotropic etching in a later stage. Therefore, the thickness of the object 1 and the aperture size of the through holes 24 can be controlled accurately at the same time, so that appropriately forming the modified regions 71, 73, for example, can adjust the time required for penetrating the modified regions 72, whereby the final thickness of the substrate 10x can be set.

Since the modified regions 71, 73 extend parallel to the Z direction as mentioned above, it becomes easier to specify and manage the converging point of the laser light L when forming the modified regions 71, 73, whereby the laser processing can be facilitated.

Figure 14:
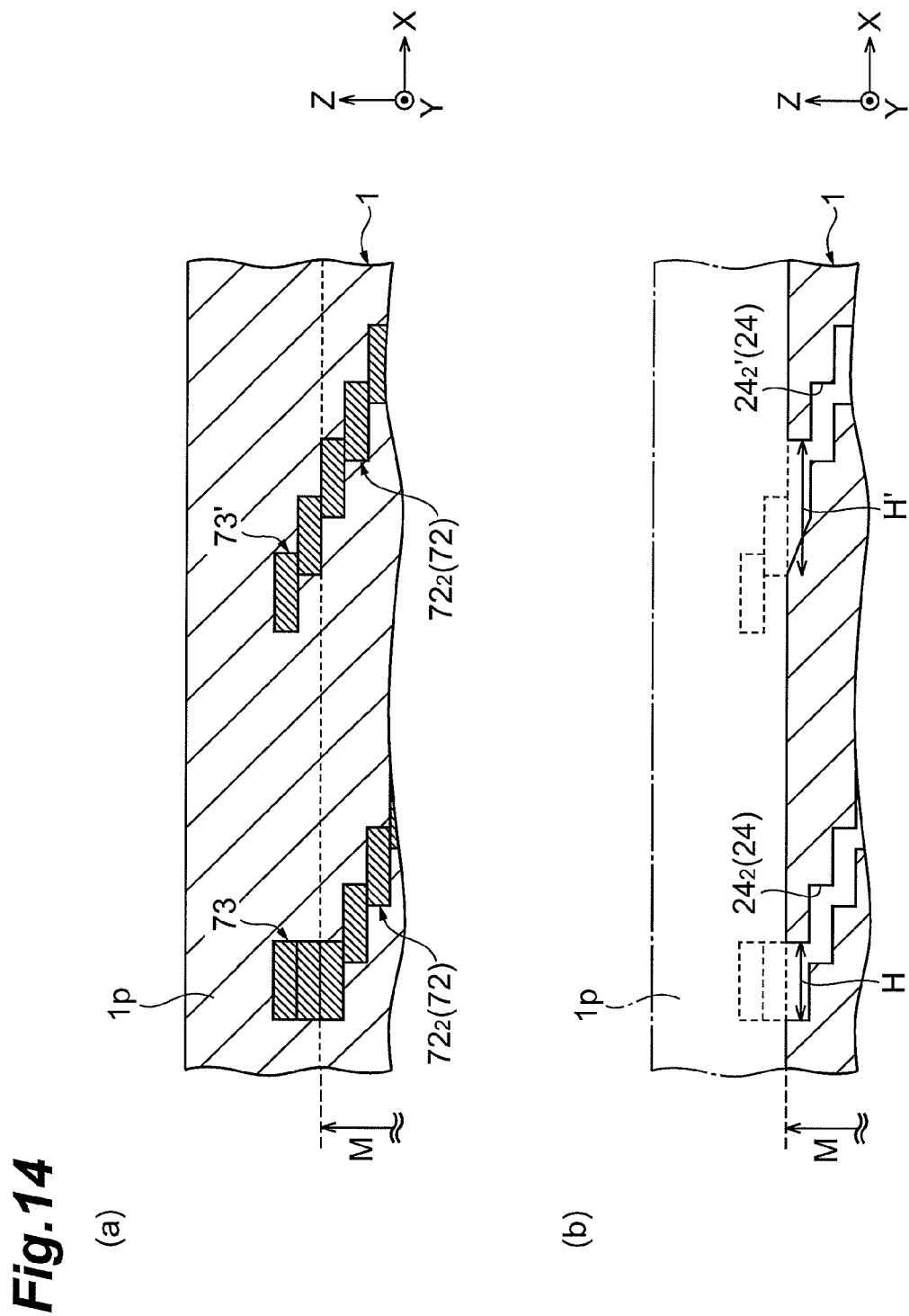
[FIG. 14] (a) is an enlarged sectional view illustrating a part of the object after forming modified regions therein, while (b) is an enlarged sectional view illustrating a part of the object after forming through holes therein.

FIG. 14(a) is an enlarged sectional view illustrating a part of the object after forming modified regions therein, while FIG. 14(b) is an enlarged sectional view illustrating a part of the object after forming through holes therein. As illustrated in FIG. 14, when the modified regions 73 extending parallel to the Z direction are formed in the removing part p1 such as to join with the modified regions $72_2$ (i.e., when the modified regions 73 are stacked along a line parallel to the Z direction), the aperture size H on the opening side of the through hole $24_2$ formed by anisotropic etching is relatively small in conformity to the size of the modified regions 73.

When modified regions 73' tilted in the Z direction are formed such as to join with the modified regions $72_2$ (i.e., when the modified regions 73' are formed by stacking while being shifted in the X direction so as to be tilted with respect to the Z direction), on the other hand, the aperture size H' on the opening side of the resulting through hole $24_2$' is larger than the aperture size H. Therefore, when reducing the aperture size H on the opening side of the through hole 24, it is preferred for the modified regions 73 (71) formed in the removing part 1p to extend parallel to the Z direction.

Since the modified regions 71, 73 are not exposed to the front face 3 and rear face 21 of the object 1 as mentioned above, this embodiment can inhibit the etching of the modified regions 72 from advancing in excess when the object 1 attains the target thickness M and thereby increasing the aperture size on the opening side of the through hole 24 and its inner width.

As mentioned above, this embodiment repeatedly performs the scan along the X direction while changing the depth position of the converging point in the Z direction (see FIGS. 9(b) to 11(b); first step) and repeatedly performs the same while changing the position of the converging point in the Y direction (second step), thereby forming a plurality of through holes 24. This can restrain the converging point from moving uselessly and enables rapid processing, thereby shortening the takt time (processing time) and lowering the cost.

As in the foregoing, the through holes 24 aligning in the X direction are staggered in the Y direction when seen from the front face 3 in this embodiment. Therefore, a plurality of through holes 24 and a plurality of through-hole electrodes 10y can be arranged denser than in the case where the plurality of through holes 24 and a plurality of through-hole electrodes 10y are arranged into a simple lattice as seen from the front face 3. This can also increase the numbers of through holes 24 and through-hole electrodes 10y that can be formed in the object 1, thereby achieving a higher wiring density in the interposer 10.

The interposer 10 in accordance with this embodiment has the through-hole electrodes 10y tilted with respect to the Z direction, which makes it unnecessary to stack a plurality of substrates 10x for changing wiring pitches, whereby its weight, thickness, and cost can be reduced. In addition, this can simplify the wiring and attain very fine wiring pitches, so as to facilitate designing and lower the electric resistance in wiring.

Since the substrate 10x is made of silicon, this embodiment can enhance heat dissipation while restraining the wiring from breaking under the influence of thermal expansion differences when the semiconductor device 11 is made of silicon.

When forming the through holes 24, this embodiment can remove the modified regions 7 and fractures incorporated therein from the object 1 after the processing by anisotropic etching and thus can improve its strength and quality. Since no cutting dusts occur during processing, an environment-friendly processing method can be achieved.

Though a preferred embodiment of the present invention has been explained in the foregoing, the present invention is not limited thereto but may be modified or applied to others within the scope not changing the gist recited in each claim.

For example, the laser light entrance surface for forming the modified regions 7 is not limited to the front face 3 of the object 1, but may be the rear face 21 of the object 1. Though the modified regions 71, 73 respectively joining with the modified regions 72 on the rear face 21 side and the front face 3 side are formed in the removing parts 1p as those guiding the etching to the modified regions 72 in the above-mentioned embodiment, one of them may be formed alone. While the above-mentioned embodiment forms the through holes 24 constituting the through-hole electrodes 10y of the interposer 10, the present invention is not only applicable thereto but may form through holes as spaces, meshes, and flow paths, for example.

The direction and order of scans in the above-mentioned embodiment are not limited. For example, the scan along the X direction may be repeatedly performed while changing the position of the converging point in the Y direction, and the same may be repeatedly performed while changing the depth position of the converging point in the Z direction, so as to form a plurality of through holes 24. For example, irradiation with the laser light L may be performed while moving its converging point along one through hole 24 so as to form a modified region 7, and the same may be repeated by the number of through holes 24, so as to form a plurality of through holes 24.

The on/off irradiation with the laser light L in the above-mentioned embodiment may be performed not only by controlling the on/off of the emission of the laser light L, but also by opening/closing a shutter disposed on the optical path of the laser light L or by masking on/off the front face 3 of the object 1, for example.

Further, the intensity of the laser light L may be controlled between an intensity at a threshold for forming the modified regions 7 (processing threshold) or higher and an intensity lower than the processing threshold. The above-mentioned term "parallel" encompasses those substantially parallel and those intended to be parallel.

The above-mentioned embodiment can adjust the etchant (e.g., add additives such as alcohols and surfactants), so as to change the etchant rate in a specific crystal orientation, thereby forming a through hole having a desirable rectangular cross-sectional form (inner wall form). For example, anisotropic etching with an etchant doped with IPA (isopropyl alcohol) can make a through hole 24 with an oblong cross section as illustrated in FIG. 15(a). For example, anisotropic etching with an etchant doped with a surfactant can make a through hole 24 with a square cross section as illustrated in FIG. 15(b).

INDUSTRIAL APPLICABILITY

The laser processing method of the present invention can accurately form through holes and facilitate the processing.

REFERENCE SIGNS LIST

1 . . . object; 1p . . . removing part (part to be removed); 3 . . . front face (main face); 7 . . . modified region; 21 . . . rear face (main face); 24 . . . through hole; 71, 73 . . . modified region (second modified region); 72 . . . modified region (first modified region); L . . . laser light; M . . . target thickness

The invention claimed is:
1. A laser processing method comprising:
a laser light converging step of converging a laser light at a sheet-like object to be processed made of silicon so as to form a modified region within the object; and
an etching step of anisotropically etching the object so as to thin the object to a target thickness and advancing the etching selectively along the modified region so as to form the object with a through hole tilted with respect to a thickness direction of the object after the laser light converging step;
wherein the laser light converging step forms a first modified region as the modified region in a part corresponding to the through hole in the object and a second modified region as the modified region extending parallel to the thickness direction and joining with the first modified region in a part to be removed upon thinning by the anisotropic etching in the object;
wherein the etching step advances the etching selectively along the second modified region and then along the first modified region while thinning the object and completes forming the through hole when the object is at the target thickness; and
wherein the laser light converging step comprises:
a first step of repeatedly performing a step of irradiating the object with the laser light while relatively moving a converging point of the laser light along a first direction orthogonal to an irradiation direction of the laser light, while changing a depth position of the converging point in the irradiation direction; and a second step of repeatedly performing the first step while changing a position of the converging point in a second direction orthogonal to the irradiation direction and first direction.

2. A laser processing method comprising:

a laser light converging step of converging a laser light at a sheet-like object to be processed made of silicon so as to form a modified region within the object; and an etching step of anisotropically etching the object so as to thin the object to a target thickness and advancing the etching selectively along the modified region so as to form the object with a through hole tilted with respect to a thickness direction of the object after the laser light converging step;

wherein the laser light converging step forms a first modified region as the modified region in a part corresponding to the through hole in the object and a second modified region as the modified region extending parallel to the thickness direction and joining with the first modified region in a part to be removed upon thinning by the anisotropic etching in the object;

wherein the etching step advances the etching selectively along the second modified region and then along the first modified region while thinning the object and completes forming the through hole when the object is at the target thickness;

wherein the object has a main face in a (100) plane; and wherein the laser light converging step comprises:

a first step of repeatedly performing a step of irradiating the object with the laser light while relatively moving a converging point of the laser light along a first direction orthogonal to an irradiation direction of the laser light, while changing a depth position of the converging point in the irradiation direction; and a second step of repeatedly performing the first step while changing a position of the converging point in a second direction orthogonal to the irradiation direction and first direction.

* * * * *